US010079416B2

(12) United States Patent
Moon et al.

(10) Patent No.: US 10,079,416 B2
(45) Date of Patent: Sep. 18, 2018

(54) MICROWAVE FILTER SYSTEM INCLUDING FEEDBACK STRUCTURE

(71) Applicant: Electronics and Telecommunications Research Institute, Daejeon (KR)

(72) Inventors: Seong Mo Moon, Daejeon (KR); In Bok Yom, Daejeon (KR); Moon-Que Lee, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/462,000

(22) Filed: Mar. 17, 2017

(65) Prior Publication Data

US 2018/0108963 A1     Apr. 19, 2018

(30) Foreign Application Priority Data

Oct. 13, 2016   (KR) .................. 10-2016-0132818

(51) Int. Cl.
*H01P 5/12*     (2006.01)
*H01P 1/201*    (2006.01)
*H01P 1/18*     (2006.01)
*H01P 1/22*     (2006.01)
*H01P 1/00*     (2006.01)
*H03H 7/00*     (2006.01)

(52) U.S. Cl.
CPC ............. *H01P 1/201* (2013.01); *H01P 1/00* (2013.01); *H01P 1/18* (2013.01); *H01P 1/22* (2013.01); *H01P 5/12* (2013.01); *H03H 7/00* (2013.01)

(58) Field of Classification Search
CPC ........ H01P 1/183; H01P 1/20; H01P 1/20309; H01P 5/12; H01P 1/201; H01P 1/18; H01P 1/22

See application file for complete search history.

(56) References Cited

U.S. PATENT DOCUMENTS

| 6,091,289 A | 7/2000 | Song et al. |
| 6,121,825 A | 9/2000 | Ko et al. |
| 7,116,966 B2 | 10/2006 | Hattori et al. |

(Continued)

OTHER PUBLICATIONS

Andersson, Stefan, et al. "An Active Recursive RF Filter in 0.35 μm BiCMOS." *Analog Integrated Circuits and Signal Processing* 44.3 (2005) (6 pages, in English).

(Continued)

*Primary Examiner* — Robert J Pascal
*Assistant Examiner* — Kimberly Glenn
(74) *Attorney, Agent, or Firm* — NSIP Law

(57) ABSTRACT

Provided is a microwave filter system having a feedback structure. The microwave filter system may include an input hybrid coupler configured to output first output signals having a phase difference with respect to an input signal; filters disposed to be in parallel with an output end of the input hybrid coupler, and configured to filter the first output signals; and an output hybrid coupler configured to output second output signals having a phase difference with respect to each of signals filtered through the filters. An output signal of the output hybrid coupler is applied to an input end of the input hybrid coupler along a feedback path.

6 Claims, 4 Drawing Sheets

(56) References Cited

U.S. PATENT DOCUMENTS

| | | | |
|---|---|---|---|
| 8,364,091 B2* | 1/2013 | Ko | H04B 7/0617 |
| | | | 370/252 |
| 8,514,960 B2 | 8/2013 | Seo et al. | |
| 9,548,708 B2* | 1/2017 | Reuven | H01P 5/18 |
| 2015/0236842 A1* | 8/2015 | Goel | H04L 5/1461 |
| | | | 370/278 |

OTHER PUBLICATIONS

Delmond, M., et al. "Microwave Tunable Active Filter Design in MMIC Technology Using Recursive Concepts." *Microwave and Millimeter-Wave Monolithic Circuits Symposium, 1995. Digest of Papers., IEEE 1995.* (4 pages, in English).

\* cited by examiner

MICROWAVE FILTER SYSTEM INCLUDING FEEDBACK STRUCTURE

CROSS-REFERENCE TO RELATED APPLICATION(S)

This application claims the priority benefit of Korean Patent Application No. 10-2016-0132818 filed on Oct. 13, 2016, in the Korean Intellectual Property Office, the disclosure of which is incorporated herein by reference for all purposes.

BACKGROUND

1. Field

One or more example embodiments relate to a microwave filter system having a feedback structure, and more particularly, to a microwave filter having a feedback structure that may decrease an input/output reflection loss and achieve not an insertion loss but a gain.

2. Description of Related Art

With the development in Internet technology (IT), frequency resources of a low frequency band used for the industrial purpose is being depleted. To solve the above issue, researches are currently conducted to use a broad frequency band ranging from a few to tens of gigahertz (GHz), such as microwave and millimeter wave bands.

In particular, a frequency filter is an important part used to selectively receive and transmit a signal of a specific frequency band, and requires an excellent selectivity and input/output matching characteristic. To meet the requirements, a high-order filter is to be configured by applying a plurality of integrated chips (ICs) on a substrate. However, the high-order filter may not be readily configured due to some difficulties coming from characteristics of the substrate and the ICs.

In the related art, researches on a microwave filter including a feedback circuit using two power dividers haven conducted. However, since a power divider does not include an isolated port, the leakage of a signal may occur. Accordingly, a signal distortion may occur or a group delay characteristic may be degraded in the microwave filter according to the related art. Also, in the microwave filter, overlapping may occur between a signal input to the feedback circuit and an original signal. Accordingly, a signal distortion may occur.

SUMMARY

One or more example embodiments provide a microwave filter that may improve an isolation of a feedback path using a hybrid coupler including an isolated port and filters generated from a single filter, each to have ½ order desired to be configured, and may simplify a circuit configuration.

According to an aspect, there is provided a microwave filter system including an input hybrid coupler configured to output first output signals having a phase difference with respect to an input signal; filters disposed to be in parallel with an output end of the input hybrid coupler, and configured to filter the first output signals; and an output hybrid coupler configured to output second output signals having a phase difference with respect to each of signals filtered through the filters. An output signal of the output hybrid coupler is applied to an input end of the input hybrid coupler along a feedback path.

The filters may be generated from a single filter, each to have ½ of order desired to be configured.

The microwave filter system may further include an amplifier and an attenuator configured to adjust the entire gain of the microwave filter system on the feedback path.

The microwave filter system may further include a phase shifter configured to adjust a phase of the output signal of the output hybrid coupler for enhancing a group delay characteristic and a roll-off characteristic on the feedback path.

The input hybrid coupler may be configured to output the first output signals having a phase difference of 90 degrees with respect to the input signal.

The output hybrid coupler may be configured to generate a synthesis and an offset of the second output signals by outputting the second output signals having a phase difference of 90 degrees with respect to each of the filtered signals.

According to example embodiments, there may be provided a microwave filter that may improve an isolation of a feedback path using a hybrid coupler including an isolated port and filters generated from a single filter each to have ½ of order desired to be configured, and may simplify a circuit configuration.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
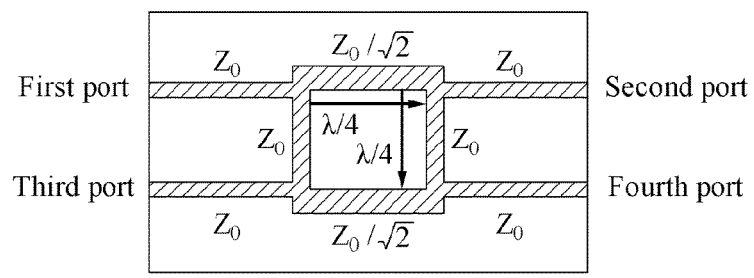
FIG. 1 illustrates an example of a hybrid coupler according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

The following detailed structural or functional description of example embodiments is provided as an example only and various alterations and modifications may be made to the example embodiments. Accordingly, the example embodiments are not construed as being limited to the disclosure and should be understood to include all changes, equivalents, and replacements within the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component. On the contrary, it should be noted that if it is described that one component is "directly connected", "directly coupled", or "directly joined" to another component, a third component may be absent. Expressions describing a relationship between components, for example, "between", directly between", or "directly neighboring", etc., should be interpreted to be alike.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

The example embodiments will be described with reference to the accompanying drawings. However, the present disclosure is not limited thereto or restricted thereby. Like reference numerals in the drawings refer to like elements throughout.

FIG. 1 illustrates an example of a hybrid coupler according to an example embodiment.

A filter having an existing feedback circuit may configure the feedback circuit using two power dividers. However, since the power divider does not include an isolated port, leakage may occur in an input signal. As a result, a distortion may occur in the input signal or a group delay characteristic may be degraded. Also, due to overlapping between a feedback signal input through the feedback circuit and the input signal, a distortion may occur in the feedback signal.

To solve the above issue, example embodiments provide a method of constituting a feedback circuit using two 90-degree hybrid couplers. Here, the 90-degree hybrid coupler is also referred to as a branch-line hybrid coupler, and may function as a power divider or may function as the power divider and a power synthesizer simultaneously.

In detail, the 90-degree hybrid coupler includes four ports. For example, if the 90-degree hybrid coupler functions as the power divider, the same amount of power may be distributed to a second port and a third port of an output end in response to an input signal to a first port. Here, output signals output through the second port and the third port of the output end may have a phase difference of 90 degrees with respect to each other. A remaining fourth port may be an isolated port to which the power is not transferred.

Also, if the 90-degree hybrid coupler functions as the power synthesizer, a power sum of input signals may be performed using one of the second port and the third port of the output end in response to input signals being applied to the first port and the fourth port. A remaining port may be an isolated port to which power is not transferred.

A microwave filter system according to an example embodiment may prevent leakage from occurring in an input signal using an isolated port of a 90-degree hybrid coupler. Also, overlapping may not occur between a feedback signal input through a feedback path including the 90-degree hybrid coupler and an input signal and thus, it is possible to prevent a distortion from occurring in the feedback signal.

Figure 2:
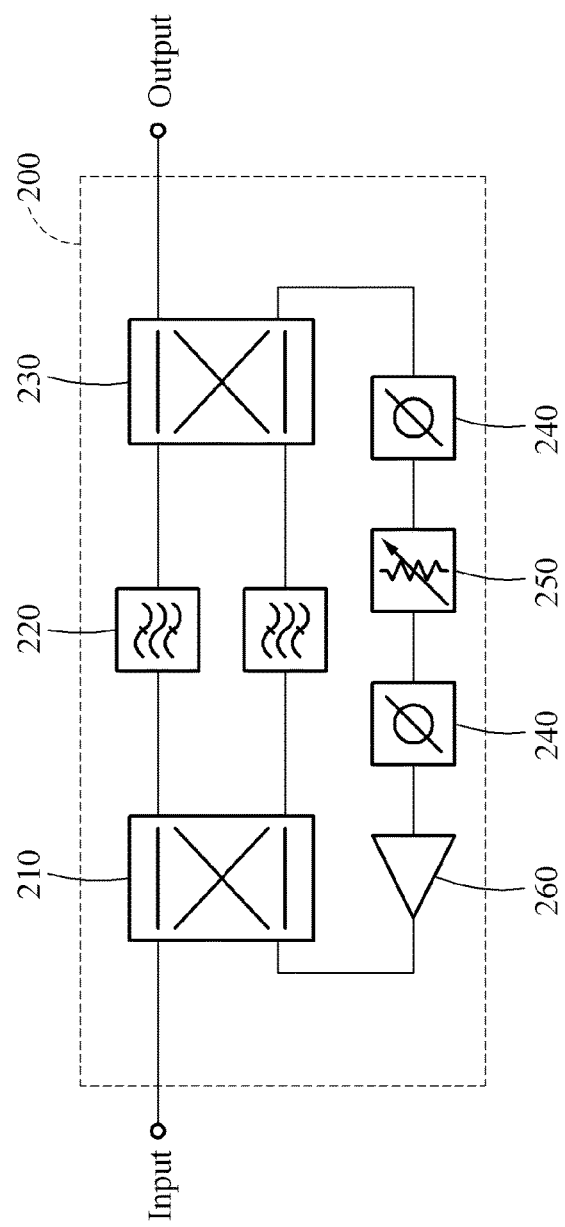
FIG. 2 illustrates an example of a configuration of a microwave filter system according to an example embodiment.

FIG. 2 illustrates an example of a configuration of a microwave filter system according to an example embodiment.

Referring to FIG. 2, a microwave filter system 200 may include an input hybrid coupler 210, filters 220, an output hybrid coupler 230, a phase shifter 240, an attenuator 250, and an amplifier 260.

The input hybrid coupler 210 may output first output signals having a phase difference with respect to an input signal that is input to the microwave filter system 200. In detail, the input hybrid coupler 210 may output the first output signals having a phase difference of 90 degrees with respect to the input signal as a 90-degree hybrid coupler.

For example, when it is assumed that an input signal having a phase of 0 degree is input to a first port of the input hybrid coupler 210, the input hybrid coupler 210 may output first output signals having a phase difference of 90 degrees with respect to the input signal having the phase of 0 degree through a second port and a third port of an output end of the input hybrid coupler 210. That is, the input hybrid coupler 210 may output the first output signal having the phase of 0 degree, which is the same as that of the input signal, through the second port and may output the first output signal having the phase of 90 degrees through the third port. Here, a fourth port of the input hybrid coupler 210 is an isolated port to which power is not transferred.

The filters 220 may filter the first output signals that are output from the out end of the input hybrid coupler 210. Here, the filters 220 may be generated from a single filter each to have ½ of order desired to be configured at the microwave filter system 200.

As described above, an existing filter according to the related art is an important part used to selectively receive and transmit a signal of a specific frequency band, and requires an excellent selectivity and input/output matching characteristic. To meet the requirements, a high-order filter needs to be configured by applying a plurality of integrated chips (ICs) on a substrate. However, according to an increase in the order of the filter, a response of the filter may become sharp. Accordingly, a pass/blockage characteristic may be enhanced, whereas an insertion loss or a group delay characteristic may be degraded and a size of the filter may increase.

Accordingly, the microwave filter system 200 may employ the filters 220 that are generated from a single filter that is to be configured to have high order, such that each filter 220 may have ½ of the high order. For example, in the case of a second-order filter to be configured, the microwave filter system 200 may easily configure a circuit by filtering the input signal using two first-order filters.

The output hybrid coupler 230 may output second output signals having a phase difference with respect to each of signals filtered through the filters 220. In detail, the output hybrid coupler 230 may output the second output signals having a phase difference of 90 degrees with respect to each of the filtered signals, thereby generating a synthesis and an offset of the second output signals.

For example, when it is assumed that the filtered signals have a phase of 0 degree and a phase of 90 degrees, respectively, the signal having the phase of 0 degree is input to a first port of the output hybrid coupler 230, and the signal having the phase of 90 degrees is input to a fourth port of the output hybrid coupler 230, the output hybrid coupler 230 may output the second output signals having a phase difference of 90 degrees with respect to the signal having the phase of 0 degree, which is input to the first port. That is, the output hybrid coupler 230 may output the second output signal having the phase of 0 degree, which is the same as that of the input signal, through a second port of the output hybrid coupler 230, and may output the second output signal having the phase of 90 degrees through a third port of the output hybrid coupler 230.

At the same time, the output hybrid coupler 230 may output the second output signals having the phase difference of 90 degrees with respect to the signal having the phase of 90 degrees, which is input to the fourth port. That is, the output hybrid coupler 230 may output the second output signal having the phase of 90 degrees, which is the same as that of the input signal, through the third port, and may output the second output signal having a phase of 180 degree through the second port.

Since the second output signal having the phase of 0 degree and the second output signal having the phase of 180 degree are output through the second port, a signal offset may occur. Also, since the second output signals all having the phase of 90 degrees are output through the third port, a signal synthesis may occur.

The phase shifter 240 may be disposed on a feedback path of the microwave filter system 200 and may adjust a phase of an output signal of the output hybrid coupler 230, thereby enhancing a group delay characteristic and a roll-off characteristic of the microwave filter system 200.

The attenuator 250 and the amplifier 260 may be disposed on the feedback path of the microwave filter system 200 and may adjust the entire gain of the microwave filter system 200.

Figure 3:
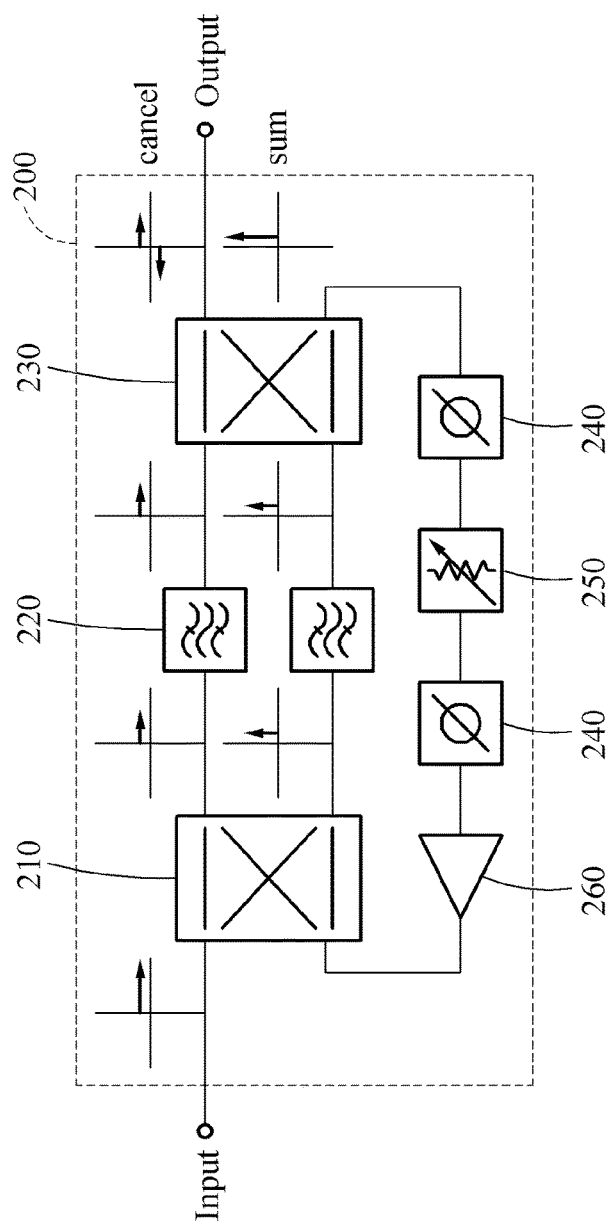
FIG. 3 illustrates an example of a first operation of a microwave filter system according to an example embodiment.

FIG. 3 illustrates an example of a first operation of a microwave filter system according to an example embodiment.

The input hybrid coupler 210 of the microwave filter system 200 may output first output signals having a phase difference of 90 degrees with respect to an input signal that is input to the first port of the input hybrid coupler 210.

For example, in response to an input signal having a phase of 0 degree being input to the first port of the input hybrid coupler 210, the input hybrid coupler 210 may output a first output signal having a phase of 0 degree, which is the same as that of the input signal, through the second port of the output end of the input hybrid coupler 210, and may output a first output signal having a phase of 90 degrees through the third port of the output end of the input hybrid coupler 210.

The first output signals being output subsequently may be filtered through the filters 220 that are connected in parallel to the second port and the third port that constitute the output end of the input hybrid coupler 210. When a delay of the filters 220 is assumed as 0, the filters 220 may filter the first output signals, may selectively allow or not allow a signal having the same phase and corresponding to a specific frequency band to pass, and thereby may output the filtered signals. The filtered signals may be input to the first port and the fourth port of the output hybrid coupler 230.

The output hybrid coupler 230 may output second output signals having a phase difference of 90 degrees with respect to the filtered signals that are input to the first port and the fourth port.

In detail, a signal having a phase of 0 degree may be input to the first port of the output hybrid coupler 230 and a signal having a phase of 90 degrees may be input to the fourth port. In this case, the output hybrid coupler 230 may output the second output signals having the phase difference of 90 degrees with respect to the signal having the phase of 0 degree, which is input to the first port. That is, the output hybrid coupler 230 may output the second output signal having the phase of 0 degree, which is the same as that of the input signal, through the second port of the output hybrid coupler 230, and may output the second output signal having the phase of 90 degrees through the third port of the output hybrid coupler 230.

At the same time, the output hybrid coupler 230 may output the second output signals having the phase difference of 90 degrees with respect to the signal having the phase of 90 degrees, which is input to the fourth port. That is, the output hybrid coupler 230 may output the second output signal having the phase of 90 degrees, which is the same as that of the input signal, through the third port, and may output the second output signal having the phase of 180 degree through the second port.

Here, since the second output signal having the phase of 0 degree and the second output signal having the phase of 180 degree are output through the second port, a signal offset may occur. Also, since the second output signals all having the phase of 90 degrees are output through the third port, a signal synthesis may occur. In this example, in a first operation, the microwave filter system 200 may apply the second output signal in which the signal synthesis has occurred to an input end of the input hybrid coupler 210 along the feedback path as a feedback signal. That is, in the first operation, the microwave filter system 200 may apply the feedback signal that is output through the third port of the output hybrid coupler 230, to the fourth port of the input hybrid coupler 210 along the feedback path.

Here, the fourth port of the input hybrid coupler 210 is an isolated port. Thus, since overlapping with an input signal that is input to the first port does not occur, it is possible to prevent a distortion from occurring in the feedback signal and to enhance a group delay characteristic.

The microwave filter system 200 may adjust a phase of the feedback signal using the phase shifter 240 disposed on the feedback path, thereby enhancing the group delay characteristic and the roll-off characteristic of the microwave filter system 200.

Also, the microwave filter system 200 may adjust the entire gain of the microwave filter system 200 using the attenuator 250 and the amplifier 260 disposed on the feedback path.

Figure 4:
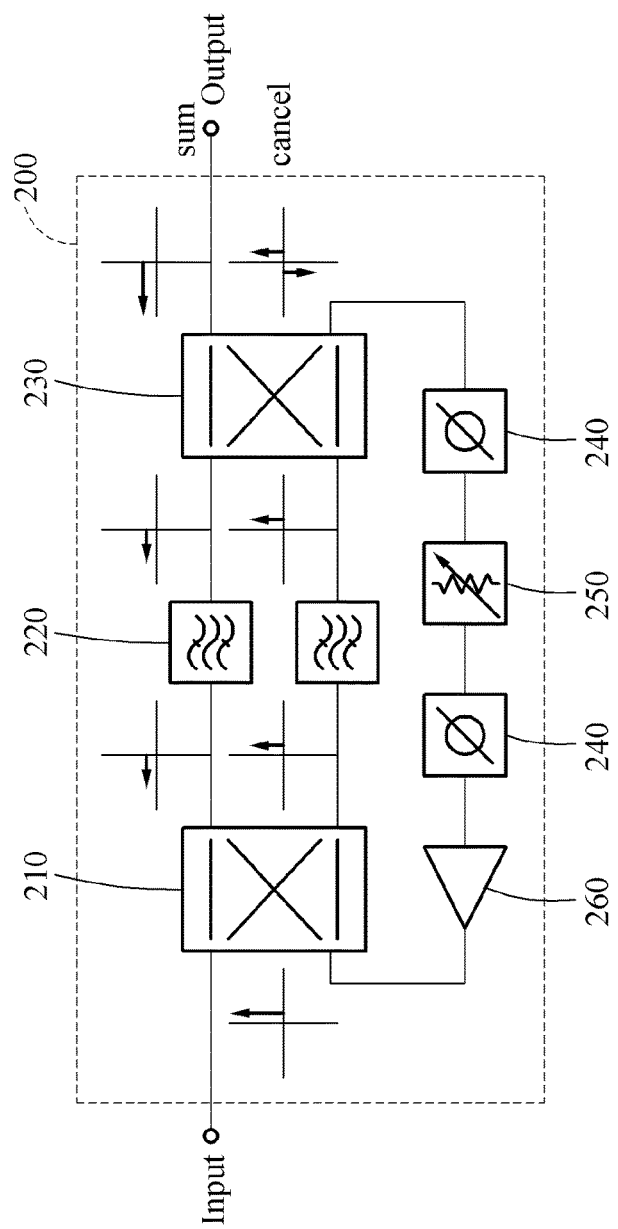
FIG. 4 illustrates an example of a second operation of a microwave filter system according to an example embodiment.

FIG. 4 illustrates an example of a second operation of a microwave filter system according to an example embodiment.

The input hybrid coupler 210 of the microwave filter system 200 may output first signals having a phase difference of 90 degrees with respect to a feedback signal that is input to the fourth port of the input hybrid coupler 210.

For example, through the first operation of the microwave filter system 200, the feedback signal having a phase of 90 degrees is input to the fourth port. Thus, the input hybrid coupler 210 may output a first output signal having a phase of 90 degrees, which is the same as that of the feedback signal, through the third port of the output end of the of the input hybrid coupler 210, and may output the first output signal having the phase of 180 degrees through the second port of the output end of the of the input hybrid coupler 210.

The first output signals being output subsequently may be filtered through the filters 220 that are connected in parallel to the second port and the third port that constitute the output end of the input hybrid coupler 210. When a delay of the filters 220 is assumed as 0, the filters 220 may filter the first output signals, may selectively allow or not allow a signal having the same phase and corresponding to a specific frequency band to pass, and thereby may output the filtered signals. The filtered signals may be input to the first port and the fourth port of the output hybrid coupler 230.

The output hybrid coupler 230 may output second output signals having a phase difference of 90 degrees with respect to the filtered signals that are input to the first port and the fourth port.

In detail, a signal having a phase of 180 degrees may be input to the first port of the output hybrid coupler 230 and a signal having a phase of 90 degrees may be input to the fourth port. In this case, the output hybrid coupler 230 may output the second output signals having the phase difference of 90 degrees with respect to the signal having the phase of 180 degrees, which is input to the first port. That is, the output hybrid coupler 230 may output the second output signal having the phase of 180 degrees, which is the same as that of the input signal, through the second port, and may output, the second output signal having the phase of 270 degrees through the third port.

At the same time, the output hybrid coupler 230 may output the second output signals having the phase difference of 90 degrees with respect to the signal having the phase of 90 degrees, which is input to the fourth port. That is, the output hybrid coupler 230 may output the second output signal having the phase of 90 degrees, which is the same as that of the input signal, through the third port, and may output the second output signal having the phase of 180 degree through the second port.

Here, since the second output signals all having the phase of 180 degrees are output through the second port, a signal synthesis may occur. Since the second output signal having the phase of 90 degrees and the second output signal having the phase of 270 degrees are output through the third port, a signal offset may occur. Here, the second output signal that is output through the second port and in which the signal synthesis has occurred through the second operation may be a final output signal of the microwave filter system 200.

As described above, according to example embodiments, the microwave filter system 200 may prevent a leakage from occurring in an input signal using an isolated port of a 90-degree hybrid coupler, and may prevent a distortion from occurring in a feedback signal since overlapping does not occur between the feedback signal input along a feedback path and the input signal. Also, since a reflection loss of the input/output signal is determined based on the 90-degree hybrid coupler, it is possible to further effectively decrease the reflection loss of the input/output signal.

Also, since the microwave filter system 200 uses the filters 220 that are generated from a filter that is to be configured to have high order, such that each filter 220 may have ½ of the high order, it is possible to easily achieve a characteristic of a high order filter even when it is difficult to configure a high order filter or when a Q is low on an IC, such as MMIC.

The processing device described herein may be implemented using hardware components, software components, and/or a combination thereof. For example, the processing device and the component described herein may be implemented using one or more general-purpose or special purpose computers, such as, for example, a processor, a controller and an arithmetic logic unit (ALU, a digital signal processor, a microcomputer, a field programmable gate array (FPGA, a programmable logic unit (PLU, a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct and/or configure the processing device to operate as desired, thereby transforming the processing device into a special purpose processor. Software and/or data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM, random access memory (RAM, flash memory (e.g., USB flash drives, memory cards, memory sticks, etc., and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A microwave filter system comprising:
   an input hybrid coupler configured to output first output signals having a phase difference with respect to an input signal;
   filters disposed to be in parallel with an output end of the input hybrid coupler, and configured to filter the first output signals; and
   an output hybrid coupler configured to output second output signals having a phase difference with respect to each of signals filtered through the filters,
   wherein an output signal of the output hybrid coupler is applied to an input end of the input hybrid coupler along a feedback path.

2. The microwave filter system of claim 1, wherein the filters are generated from a single filter and each of the filters has an order that is half of an order of the single filter.

3. The microwave filter system of claim 1, further comprising:
   an amplifier and an attenuator configured to adjust an entire gain of the microwave filter system on the feedback path.

4. The microwave filter system of claim 1, further comprising:
   a phase shifter configured to adjust a phase of the output signal of the output hybrid coupler for enhancing a group delay characteristic and a roll-off characteristic on the feedback path.

5. The microwave filter system of claim 1, wherein the input hybrid coupler is configured to output the first output signals having a phase difference of 90 degrees with respect to the input signal.

6. The microwave filter system of claim 1, wherein the output hybrid coupler is configured to generate a synthesis and an offset of the second output signals by outputting the second output signals having a phase difference of 90 degrees with respect to each of the filtered signals.

* * * * *